(12) United States Patent
Kim et al.

(10) Patent No.: US 6,537,925 B2
(45) Date of Patent: Mar. 25, 2003

(54) METHOD FOR FORMING $Ta_2O_5$ DIELECTRIC LAYER USING PLASMA ENHANCED ATOMIC LAYER DEPOSITION

(75) Inventors: Kyong-Min Kim, Kyoungki-do (KR); Jong-Min Lee, Kyoungki-do (KR)

(73) Assignee: Hynix Semiconductor Inc, Kyoungki-do (KR)

( * ) Notice: Subject to any disclaimer, the term of this patent is extended or adjusted under 35 U.S.C. 154(b) by 0 days.

(21) Appl. No.: 10/006,949

(22) Filed: Dec. 4, 2001

(65) Prior Publication Data

US 2002/0086476 A1 Jul. 4, 2002

(30) Foreign Application Priority Data

Dec. 18, 2000 (KR) .......................... 2000-77835

(51) Int. Cl.[7] ............................... H01L 21/00
(52) U.S. Cl. ................. 438/758; 438/778; 438/785
(58) Field of Search .................. 438/778, 785, 438/736, 496, 585, 200

(56) References Cited

U.S. PATENT DOCUMENTS 6,380,579 B1 * 4/2002 Nam et al. .................. 257/306

FOREIGN PATENT DOCUMENTS

KR 2000-0008815 2/2000

* cited by examiner

*Primary Examiner*—David Nelms
*Assistant Examiner*—D Le
(74) *Attorney, Agent, or Firm*—Marshall, Gerstein & Borun

(57) ABSTRACT

A method for forming a $Ta_2O_5$ dielectric layer using plasma enhanced atomic layer deposition, which can improve the quality of a layer and its electric property by forming a $Ta_2O_5$ dielectric layer using a plasma enhanced atomic layer deposition. The method for forming a $Ta_2O_5$ dielectric layer using plasma enhanced atomic layer deposition, comprising the steps of: a) flowing $Ta(OC_2H_5)_5$ source gas in a chamber and generating plasma; b) depositing a $Ta_2O_5$ layer by using the plasma; c) purging the chamber; d) repeatedly performing the steps a) to c) in order to form a $Ta_2O_5$ dielectric layer; e) thermally treating the surface of the $Ta_2O_5$ dielectric layer in an oxygen atmosphere; and f) crystallizing the $Ta_2O_5$ dielectric layer.

15 Claims, 4 Drawing Sheets

METHOD FOR FORMING $Ta_2O_5$ DIELECTRIC LAYER USING PLASMA ENHANCED ATOMIC LAYER DEPOSITION

BACKGROUND

1. Technical Field

A method for forming a dielectric layer of a capacitor in a semiconductor device is disclosed. More particularly, a method for forming a $Ta_2O_5$ dielectric layer using a plasma enhanced atomic layer deposition is disclosed.

2. Description of the Related Art

As the level of integration increases in semiconductor devices like DRAMs (Dynamic Random Access Memory), superior electrical properties, such as high charge capacity in a limited space and reduced leakage current are needed in a DRAM capacitor. For this reason, a $Ta_2O_5$ dielectric layer, which is a high dielectric layer, is used for the dielectric layer of the capacitor.

Meanwhile, in case of a $Ta_2O_5$ dielectric layer deposited by the LPCVD (Low Pressure Chemical Vapor Deposition) method, the electric property of a capacitor deteriorates because of inferior step coverage.

To solve this problem, the atomic layer deposition (ALD) is used to improve the step coverage by repeatedly depositing a plurality of atomic layers.

FIGS. 1A to 1D are cross-sectional views illustrating the conventional method for forming a $Ta_2O_5$ dielectric layer.

First, as shown in FIG. 1A, after a polysilicon layer 11 to form a bottom electrode is deposited on a substrate 10 on which transistors and plugs are formed, the native oxide layer (now shown) on the surface of the polysilicon layer 11 is removed with HF or BOE (Buffer Oxide Etchant), and then the surface of the polysilicon layer 11 is subject to the RTP (Rapid Thermal Process) in the atmosphere of $NH_3$.

Subsequently, as illustrated in FIG. 1B, a $Ta_2O_5$ dielectric layer 12A is deposited on the layer 11 by performing the atomic layer deposition (ALD) and the in-situ treatment of oxygen ($O_2$) plasma.

Repeating these two procedures results in the depositing of a plurality of $Ta_2O_5$ dielectric mono layers ($12_1$~$12n$) which produces a $Ta_2O_5$ dielectric layer 12A with superior step coverage.

As illustrated in FIG. 1C, the process of oxygen ($O_2$) plasma treatment is for thermally treating the $Ta_2O_5$ dielectric layer 12A in the oxygen atmosphere. This way, a crystallized $Ta_2O_5$ dielectric layer 12 is formed.

Then, as depicted in FIG. 1D, a capacitor in a stacked structure of a polysilicon layer 11, $Ta_2O_5$ dielectric layer 12 and top electrode 13 is formed by depositing a top electrode 13 on the $Ta_2O_5$ dielectric layer 12.

The conventional method for forming a $Ta_2O_5$ dielectric layer using the atomic layer deposition (ALD) and oxygen plasma described above has following problems.

First, the poor reactivity of oxygen makes carbon A remain in the $Ta_2O_5$ dielectric layer 12. Secondly, the weak activation energy of the oxygen still makes oxygen vacancy in the $Ta_2O_5$ dielectric layer 12, causing its electric property deteriorated by leakage current.

SUMMARY OF THE DISCLOSURE

A method for forming a $Ta_2O_5$ dielectric layer using a plasma enhanced atomic layer deposition that can improve the quality of a layer and its electrical properties is disclosed.

More specifically, a method for forming a $Ta_2O_5$ dielectric layer using plasma enhanced atomic layer deposition is disclosed that comprises: a) flowing $Ta(OC_2H_5)_5$ source gas in a chamber and generating plasma; b) depositing a $Ta_2O_5$ layer by using the plasma; c) purging the chamber; d) repeatedly performing the steps a) to c) in order to form a $Ta_2O_5$ dielectric layer; e) thermally treating the surface of the $Ta_2O_5$ dielectric layer in an oxygen atmosphere; and f) crystallizing the $Ta_2O_5$ dielectric layer.

BRIEF DESCRIPTION OF THE DRAWINGS

The above and other objects and features of the disclosed process will become apparent from the following description of the preferred embodiments given in conjunction whit the accompanying drawings, wherein.

DETAILED DESCRIPTION OF THE PRESENTLY PREFERRED EMBODIMENTS

The disclosed processes will now be described in conjunction with the accompanying drawings, FIGS. 2A to 2E.

FIGS. 2A to 2E are cross-sectional views depicting a method for forming $Ta_2O_5$ dielectric layer in accordance with the disclosed process.

Figure 1A:
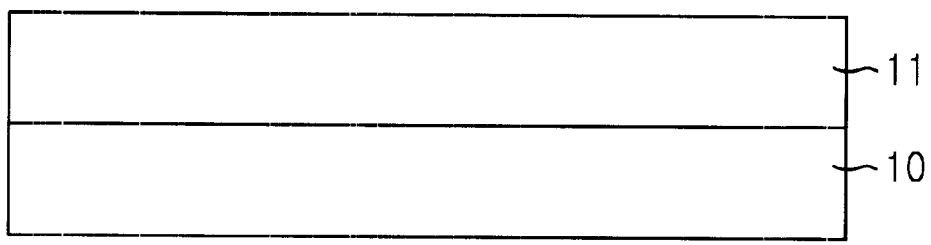
FIGS. 1A to 1D are cross-sectional views illustrating a conventional method for forming $Ta_2O_5$ dielectric layer.
Figure 1B:
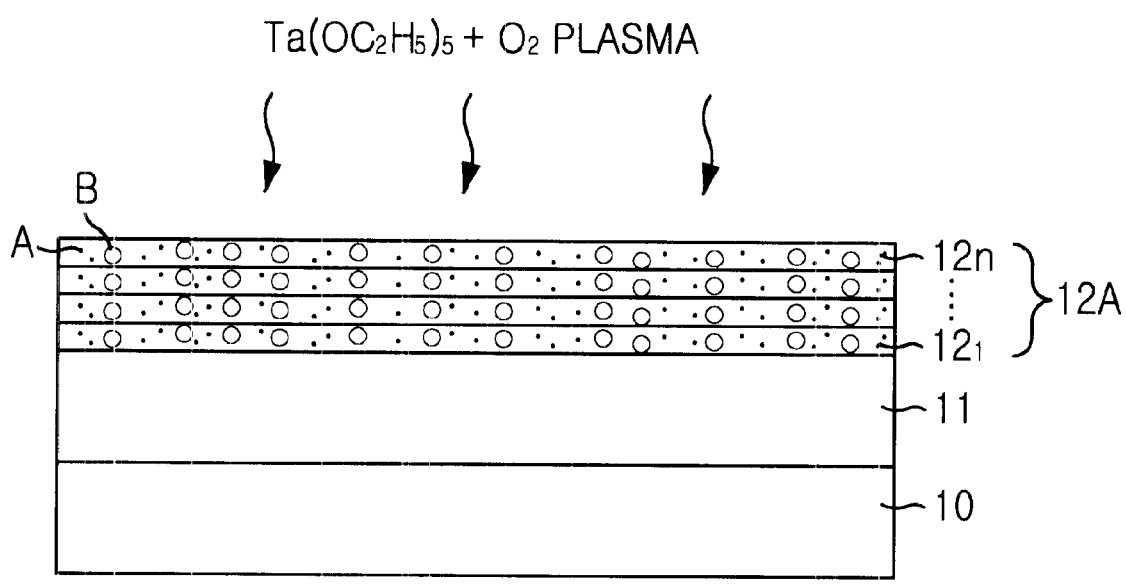
Figure 1C:
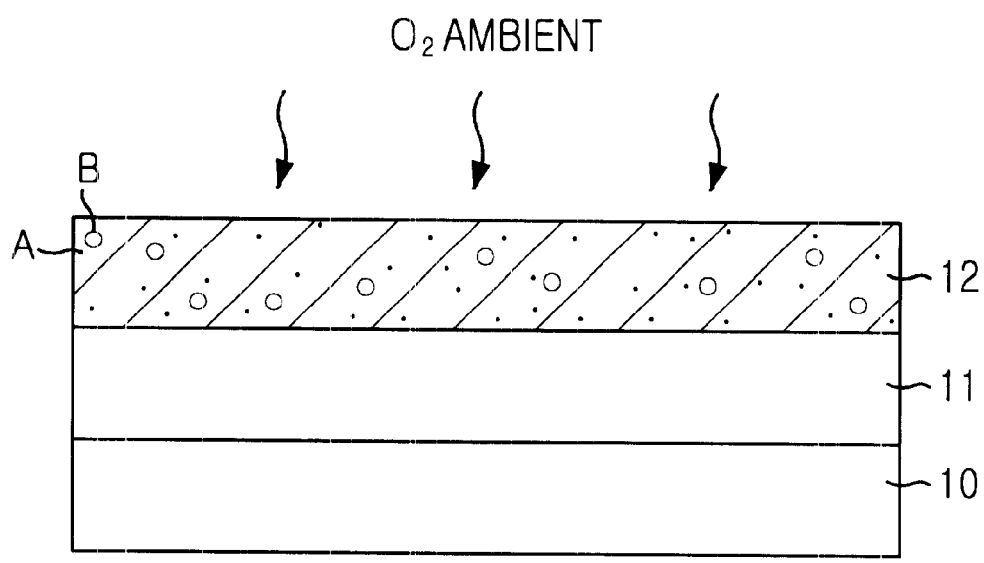
Figure 1D:
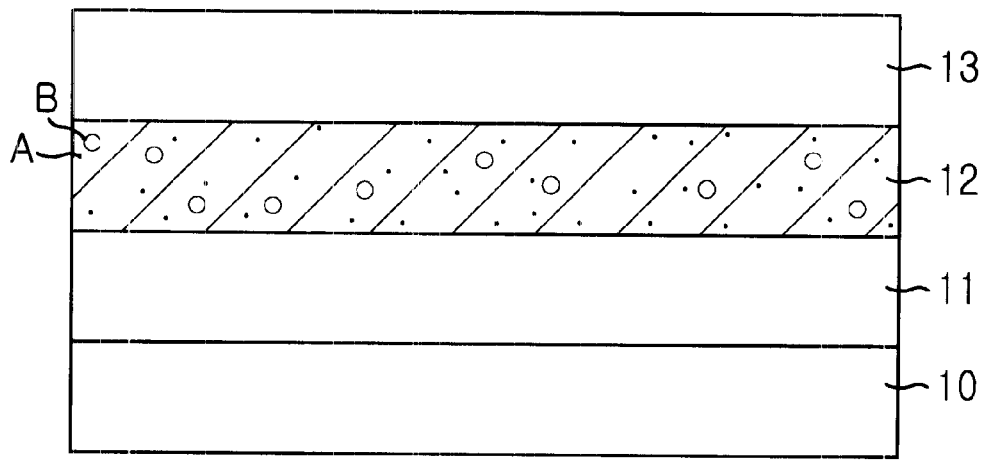
Figure 2A:
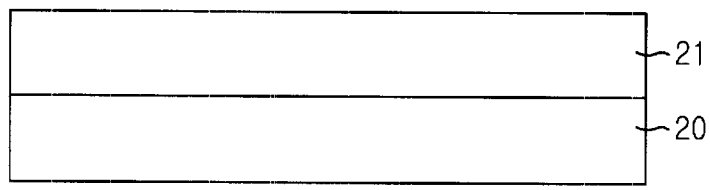
FIGS. 2A to 2E are cross-sectional views depicting a method for forming a $Ta_2O_5$ dielectric layer in accordance with an embodiment of this disclosure.

First, as illustrated in FIG. 2A, after a polysilicon layer 21 to form the bottom electrode is deposited on a substrate 20 formed with the substructure including transistors and plugs, the natural oxidation layer (now shown) on the surface of the polysilicon layer 21 is etched back with HF or BOE (Buffer Oxide Etchant), and then the surface of the polysilicon layer 21 is treated with the RTP (Rapid Thermal Process) in an ambient atmosphere of $NH_3$.

Figure 2B:
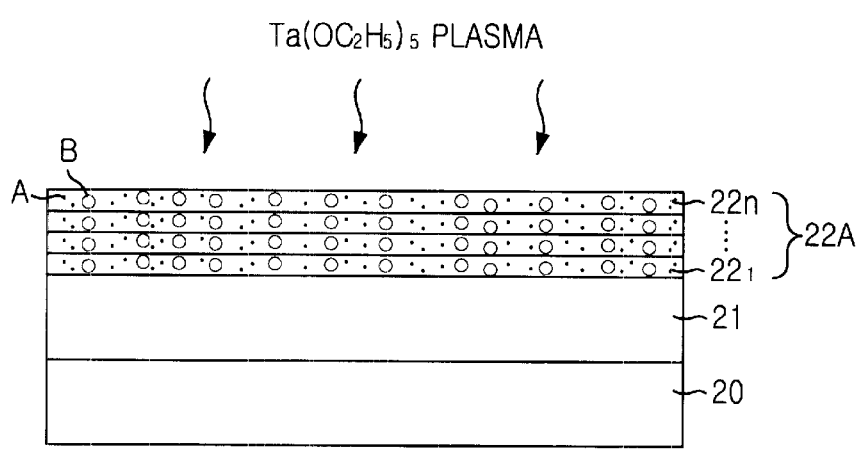

Then, as illustrated in FIG. 2B, a $Ta_2O_5$ dielectric layer 22A is formed by flowing $Ta(OC_2H_5)_5$ source in the chamber and generating Ta and oxygen plasma.

The method for depositing a $Ta_2O_5$ dielectric layer 22A using the plasma enhanced atomic layer deposition (PEALD) will be described more in detail.

Under the condition of substrate temperature ranging from about 200 to about 300° C., a chamber pressure ranging from about 0.2 to about 10 Torr with a RF power supply ranging from about 30 to about 500 W, a $Ta(OC_2H_5)_5$ source gas at a temperature ranging from about 170 to about 190° C. is flowed in the chamber at a speed ranging from about 0.006 to about 0.1 cc/min for a time period ranging from about 0.1 to about 5 seconds, thereby generating Ta and oxygen plasma.

Subsequently, with the same temperature and pressure condition maintained, a $Ta_2O_5$ mono layer $22_1$ is deposited by depositing the plasma source gas on top of the substrate for a time period ranging from about 0.1 to about 0.5 seconds. Then, it is purged with a nitrogen or argon gas for a time period ranging from about 0.2 to about 5 seconds.

Repeating the three steps of $Ta_2O_5$ mono layer formation period several times, a plurality of $Ta_2O_5$ mono layers are deposited and thus a $Ta_2O_5$ dielectric layer 22A with superior step coverage is generated.

Figure 2C:
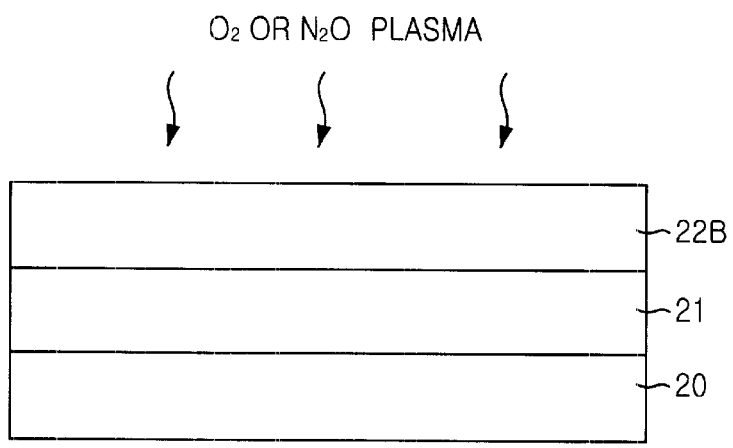

As shown in FIG. 2C, a surface-treated $Ta_2O_5$ dielectric layer 22B is formed by making oxygen or $N_2O$ a plasma and treating the surface of the $Ta_2O_5$ dielectric layer 22A with the plasma. Here, the carbon remaining in the surface-treated $Ta_2O_5$ dielectric layer 22B reacts tithe highly reactive $N_2O$ plasma to become CO or $CO_2$ and is purged. In addition, the oxygen vacancy inside the surface-treated $Ta_2O_5$ dielectric layer 22B is suppressed by the $N_2O$ plasma with high activation energy.

Figure 2D:
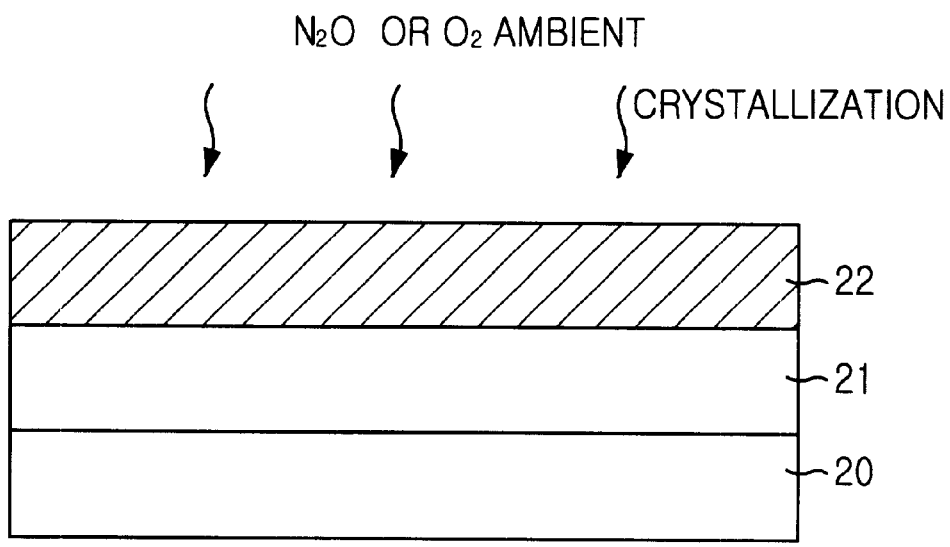

Subsequently, as illustrated in FIG. 2D, annealing the surface-treated $Ta_2O_5$ dielectric layer 22B in an ambient of $N_2O$ or oxygen at a temperature ranging from about 650 to about 800° C. for a time period ranging from about 10 to about 20 minutes, a crystallized $Ta_2O_5$ dielectric layer 22 is formed.

Figure 2E:
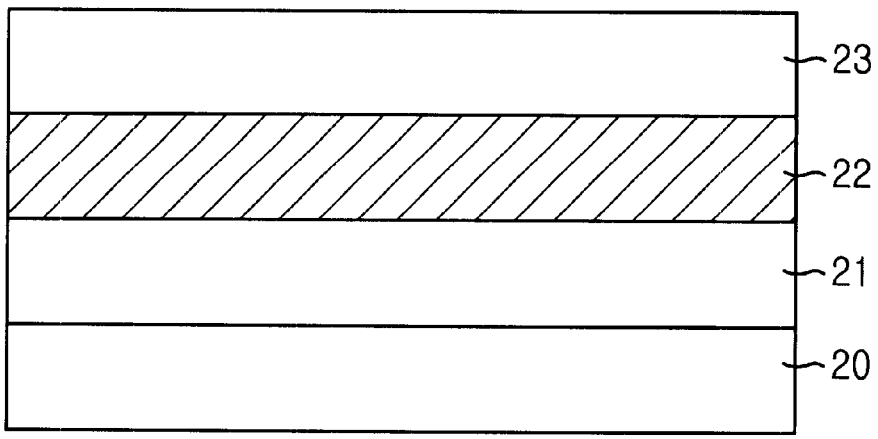

Then, as illustrated in FIG. 2E, forming a top electrode on top of the crystallized $Ta_2O_5$ dielectric layer 22, a capacitor in a stacked structure of a polysilicon layer 21, crystallized $Ta_2O_5$ dielectric layer 22 and top electrode 23 is completed.

As described above, the disclosed methods for forming a capacitor improve step coverage by forming a $Ta_2O_5$ dielectric layer using plasma enhanced atomic layer deposition, and electric property by making the layer quality of the $Ta_2O_5$ dielectric layer better.

In short, the disclosed methods can improve the layer quality of the $Ta_2O_5$ dielectric layer and heighten step coverage in a method for forming a $Ta_2O_5$ dielectric layer using plasma enhanced atomic layer deposition.

While the present invention has been described with respect to certain preferred embodiments, it will be apparent to those skilled in the art that various changes and modifications may be made without departing from the scope of the invention as defined in the following claims.

What is claimed:

1. A method for forming a $Ta_2O_5$ dielectric layer using plasma enhanced atomic layer deposition, comprising:
   a) flowing $Ta(OC_2H_5)_5$ source gas in a chamber and generating a plasma;
   b) depositing a $Ta_2O_5$ layer with the plasma;
   c) purging the chamber;
   d) repeatedly performing the steps a) to c) in order to form a $Ta_2O_5$ dielectric layer;
   e) thermally treating the surface of the $Ta_2O_5$ dielectric layer in an oxygen atmosphere; and
   f) crystallizing the $Ta_2O_5$ dielectric layer.

2. The method as recited in claim 1, wherein step a) is carried out with a temperature of the substrate ranging from about 200 to about 300° C.

3. The method as recited in claim 2, wherein step a) is carried out under a chamber pressure ranging from about 0.2 t about 10 Torr.

4. The method as recited in claim 3, wherein step a) is carried out with a supplied RF electric power ranging from about 30 to about 500 W.

5. The method as recited in claim 1, wherein a temperature of the $Ta(OC_2H_5)_5$ source gas ranges from about 170 to about 1900° C.

6. The method as recited in claim 5, wherein the $Ta(OC_2H_5)_5$ source gas has a flow rate ranging from about 0.006 to about 0.1 cc/min.

7. The method as recited in claim 6, wherein the $Ta(OC_2H_5)_5$ source gas is flowed for a time period ranging from about 0.1 to about 5 seconds.

8. The method as recited in claim 1, wherein step b) is carried out with a temperature of the substrate ranging from about 200 to about 300° C., and a chamber pressure ranging from about 0.2 to about 10 Torr.

9. The method as recited in claim 8, wherein step b) is carried out for a time period ranging from about 0.1 to about 0.5 seconds.

10. The method as recited in claim 1, wherein the chamber is purged with nitrogen or argon.

11. The method as recited in claim 1, wherein the chamber is purged for a time period ranging from about 0.2 to about 5 seconds.

12. The method as recited in claim 1, wherein during step e), the surface of the $Ta_2O_5$ dielectric layer is treated with an oxygen plasma or a $N_2O$ plasma.

13. The method as recited in claim 1, wherein step f) is carried out in an oxygen or $N_2O$ atmosphere.

14. The method as recited in claim 13, wherein step f) is carried out at a temperature ranging from about 650 to about 800° C.

15. The method as recited in claim 14, wherein the step f) is carried out a time period ranging from about 10 to about 30 minutes.

* * * * *

UNITED STATES PATENT AND TRADEMARK OFFICE
CERTIFICATE OF CORRECTION

PATENT NO.    : 6,537,925 B2
DATED         : March 25, 2003
INVENTOR(S)   : Kim et al.

It is certified that error appears in the above-identified patent and that said Letters Patent is hereby corrected as shown below:

Column 4,
Line 6, after "ranging from about" please delete "0.2 t" and insert -- 0.2 to -- in its place.
Line 12, after "about" please delete "1900° C" and insert -- 190° C -- in its place.
Line 41, after "is carried" please delete "out a time" and insert -- out at a time -- in its place.

Signed and Sealed this

Twenty-third Day of September, 2003

JAMES E. ROGAN
*Director of the United States Patent and Trademark Office*